(12) United States Patent
Kinoshita et al.

(10) Patent No.: US 11,943,873 B2
(45) Date of Patent: Mar. 26, 2024

(54) MANAGEMENT DEVICE, MOVABLE WORK DEVICE, MOUNTING SYSTEM, AND MANAGEMENT METHOD

(71) Applicant: FUJI CORPORATION, Chiryu (JP)

(72) Inventors: Kazuya Kinoshita, Toki (JP); Fumiya Mizutani, Toyota (JP); Yukihiro Yamashita, Toyohashi (JP)

(73) Assignee: FUJI CORPORATION, Chiryu (JP)

( * ) Notice: Subject to any disclaimer, the term of this patent is extended or adjusted under 35 U.S.C. 154(b) by 260 days.

(21) Appl. No.: 17/421,543

(22) PCT Filed: Feb. 6, 2019

(86) PCT No.: PCT/JP2019/004241
§ 371 (c)(1),
(2) Date: Jul. 8, 2021

(87) PCT Pub. No.: WO2020/161827
PCT Pub. Date: Aug. 13, 2020

(65) Prior Publication Data
US 2022/0104411 A1 Mar. 31, 2022

(51) Int. Cl.
*H05K 13/08* (2006.01)

(52) U.S. Cl.
CPC ....... *H05K 13/0882* (2018.08); *H05K 13/086* (2018.08); *H05K 13/087* (2018.08)

(58) Field of Classification Search
CPC . H05K 13/0882; H05K 13/086; H05K 13/087
See application file for complete search history.

(56) References Cited

U.S. PATENT DOCUMENTS

| | | | | |
|---|---|---|---|---|
| 5,584,118 A | * | 12/1996 | Furukawa | .......... G05B 19/4189 29/711 |
| 7,664,554 B2 | * | 2/2010 | Maenishi | .......... G05B 19/41805 700/9 |
| 10,996,661 B2 | * | 5/2021 | Oyama | .............. G05B 19/4189 |

(Continued)

FOREIGN PATENT DOCUMENTS

| | | | | |
|---|---|---|---|---|
| CN | 106538088 B | * | 5/2019 | ............. B65G 65/00 |
| CN | 110431928 A | * | 11/2019 | ......... G05B 19/4155 |

(Continued)

OTHER PUBLICATIONS

International Search Report dated Apr. 23, 2019 in PCT/JP2019/004241 filed on Feb. 6, 2019, 2 pages.

*Primary Examiner* — Jeffrey T Carley
(74) *Attorney, Agent, or Firm* — Oblon, McClelland, Maier & Neustadt, L.L.P.

(57) ABSTRACT

A management device includes a management control section configured to create rearrangement disposition information for rearranging recovery feeders in a recovery storage region and rearranging provision feeders in a provision storage region among feeders temporarily stored in a storage section by using storage position information regarding storage positions of the provision feeders and the recovery feeders temporarily stored in the storage section and region information including the recovery storage region and the provision storage region set in the storage section, and output the created rearrangement disposition information.

3 Claims, 5 Drawing Sheets

(56) References Cited

U.S. PATENT DOCUMENTS

| | | | | |
|---|---|---|---|---|
| 2015/0248314 A1* | 9/2015 | Morita | ................ | H05K 13/085 |
| | | | | 718/104 |
| 2017/0135255 A1* | 5/2017 | Eguchi | ............... | H05K 13/0417 |
| 2017/0354070 A1* | 12/2017 | Kobayashi | ............ | H05K 13/086 |
| 2018/0148289 A1* | 5/2018 | Oyama | .............. | H05K 13/0419 |
| 2018/0220560 A1* | 8/2018 | Otsuka | .............. | H05K 13/0452 |
| 2019/0107829 A1* | 4/2019 | Sumi | ................. | G05B 19/4188 |
| 2019/0307032 A1* | 10/2019 | Eguchi | ................... | H05K 13/02 |

FOREIGN PATENT DOCUMENTS

| | | | | |
|---|---|---|---|---|
| EP | 1 081 997 A1 | 3/2001 | | |
| EP | 3806600 A1 * | 4/2021 | ........... | H05K 13/021 |
| WO | WO 2015/004797 A1 | 1/2015 | | |
| WO | WO-2017033268 A1 * | 3/2017 | ........... | H05K 13/021 |
| WO | WO-2018179300 A1 * | 10/2018 | ........... | H05K 13/041 |
| WO | WO-2019187033 A1 * | 10/2019 | ........... | H05K 13/021 |

\* cited by examiner

Fig. 3

| ← WAREHOUSE SIDE (RECOVERY) | | | | | | | | | | | | | | | | | | | | | | | | 45A | | | | | (PROVISION) MOUNTING DEVICE SIDE → | | | | | |
|---|---|---|---|---|---|---|---|---|---|---|---|---|---|---|---|---|---|---|---|---|---|---|---|---|---|---|---|---|---|---|---|---|---|---|---|
| FEEDER STORAGE SECTION ATTACHMENT PORTION NUMBER ||||||||||||||||||||||||||||||||||||
| STORAGE MODULE 1 |||||||||||| STORAGE MODULE 2 |||||||||||| STORAGE MODULE 3 ||||||||||||
| 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 | 36 |
| RECOVERY STORAGE REGION |||||||||||||||||||| | | | | PROVISION STORAGE REGION ||||||||||||

Fig. 4

| ← WAREHOUSE SIDE (RECOVERY) | | | | | | | | | | | | | | | | | | | | | | | | 45B | | | | | (PROVISION) MOUNTING DEVICE SIDE → | | | | | |
|---|---|---|---|---|---|---|---|---|---|---|---|---|---|---|---|---|---|---|---|---|---|---|---|---|---|---|---|---|---|---|---|---|---|---|---|
| FEEDER STORAGE SECTION ATTACHMENT PORTION NUMBER ||||||||||||||||||||||||||||||||||||
| STORAGE MODULE 1 |||||||||||| STORAGE MODULE 2 |||||||||||| STORAGE MODULE 3 ||||||||||||
| 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 | 36 |
| RECOVERY STORAGE REGION |||||| PROVISION STORAGE REGION |||||| RECOVERY STORAGE REGION |||||| PROVISION STORAGE REGION |||||| RECOVERY STORAGE REGION |||||| PROVISION STORAGE REGION ||||||

Fig. 5

| ← WAREHOUSE SIDE (RECOVERY) | | | | | | | | | | | | | | | | | | | | | | | | 45C | | | | | (PROVISION) MOUNTING DEVICE SIDE → | | | | | |
|---|---|---|---|---|---|---|---|---|---|---|---|---|---|---|---|---|---|---|---|---|---|---|---|---|---|---|---|---|---|---|---|---|---|---|---|
| FEEDER STORAGE SECTION ATTACHMENT PORTION NUMBER ||||||||||||||||||||||||||||||||||||
| STORAGE MODULE 1 |||||||||||| STORAGE MODULE 2 |||||||||||| STORAGE MODULE 3 ||||||||||||
| 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 | 36 |
| | RECOVERY STORAGE REGION ||| | | | | | | | | | | | | | | | | | | | | | | | | | | | | | PROVISION STORAGE REGION |||

MANAGEMENT DEVICE, MOVABLE WORK DEVICE, MOUNTING SYSTEM, AND MANAGEMENT METHOD

TECHNICAL FIELD

The present specification discloses a management device, a movable work device, a mounting system, and a management method.

BACKGROUND ART

Conventionally, a mounting system has been proposed in which a feeder storage (storage section) is disposed in a component mounting line in which mounting devices are arranged and which includes a feeder provision section (movable work device) that is moved between the mounting devices and the feeder storage to exchange feeders (refer to, for example, Patent Literature 1). In this mounting system, the feeder can be automatically served efficiently by sequentially performing provision of a provision feeder and recovery of a recovery feeder in parallel from the mounting devices on the upstream side or the downstream side of the component mounting line by using the movable work device.

PATENT LITERATURE

Patent Literature 1: International Publication No. WO2015/004797

BRIEF SUMMARY

Technical Problem

However, in the mounting system disclosed in Patent Literature 1, disposition of a feeder in the storage section provided in the component mounting line is not considered. For example, although an operator may remove the feeder temporarily stored in the storage section, the operator may not be able to easily recognize which feeder is a recovery feeder. Although an operator may provide a new feeder in the storage section, if feeders are mixed and stored, the operator may not easily recognize at which position a recovery feeder is present and at which position a provision feeder is stored. As described above, in the mounting system, it is desirable to perform more appropriate storage according to the type of feeder in the storage section that temporarily stores the feeder.

A principal object of the present disclosure is to provide a management device, a movable work device, a mounting system, and a management method capable of performing more appropriate storage according to the type of feeder in a storage section that temporarily stores the feeder.

The present disclosure employs the following means in order to achieve the above principal object.

A management device of the present disclosure that is used in a mounting system including a mounting device which includes: a mounting section configured to mount a component on a mounting target; a supply section having an attachment portion to which a feeder holding the component is attached, and a mounting control section configured to cause the mounting section to pick up the component from the holding member, and a storage section, being provided in a production line configured by the mounting device, which is configured to temporarily store provision feeders to be provided to the supply section and recovery feeders recovered from the supply section, the management device comprising: a management control section configured to create rearrangement disposition information for rearranging the recovery feeders in a recovery storage region and rearranging the provision feeders in a provision storage region among the feeders temporarily stored in the storage section, the rearrangement disposition information being created based on storage position information regarding storage positions of the provision feeders and the recovery feeders temporarily stored in the storage section and based on region information, including the recovery storage region and the provision storage region, which is set in the storage section, and output the created rearrangement disposition information.

The management device creates the rearrangement disposition information for rearranging the recovery feeders in a recovery storage region and rearranging the provision feeders in a provision storage region among the feeders temporarily stored in the storage section by using storage position information regarding storage positions of the provision feeders and the recovery feeders temporarily stored in the storage section and region information including the recovery storage region and the provision storage region set in the storage section. The management device outputs the created rearrangement disposition information. In the management device, since the feeders temporarily stored in the storage section can be rearranged in a predetermined recovery storage region or a predetermined provision storage region by using the rearrangement disposition information, it is possible to perform more appropriate storage according to the type of feeder such as a provision feeder or a recovery feeder in the storage section that temporarily stores the feeders. Here, the management device may output the rearrangement disposition information to, for example, a notification section that notifies an operator of details of the rearrangement disposition information, or may output the information to a movable work device that moves the feeder.

BRIEF DESCRIPTION OF DRAWINGS

FIG. 3 is an explanatory diagram illustrating an example of region information 45A stored in memory section 42.

FIG. 4 is an explanatory diagram illustrating an example of region information 45B stored in memory section 42.

FIG. 5 is an explanatory diagram illustrating an example of region information 45C stored in memory section 42.

DESCRIPTION OF EMBODIMENTS

Figure 1:
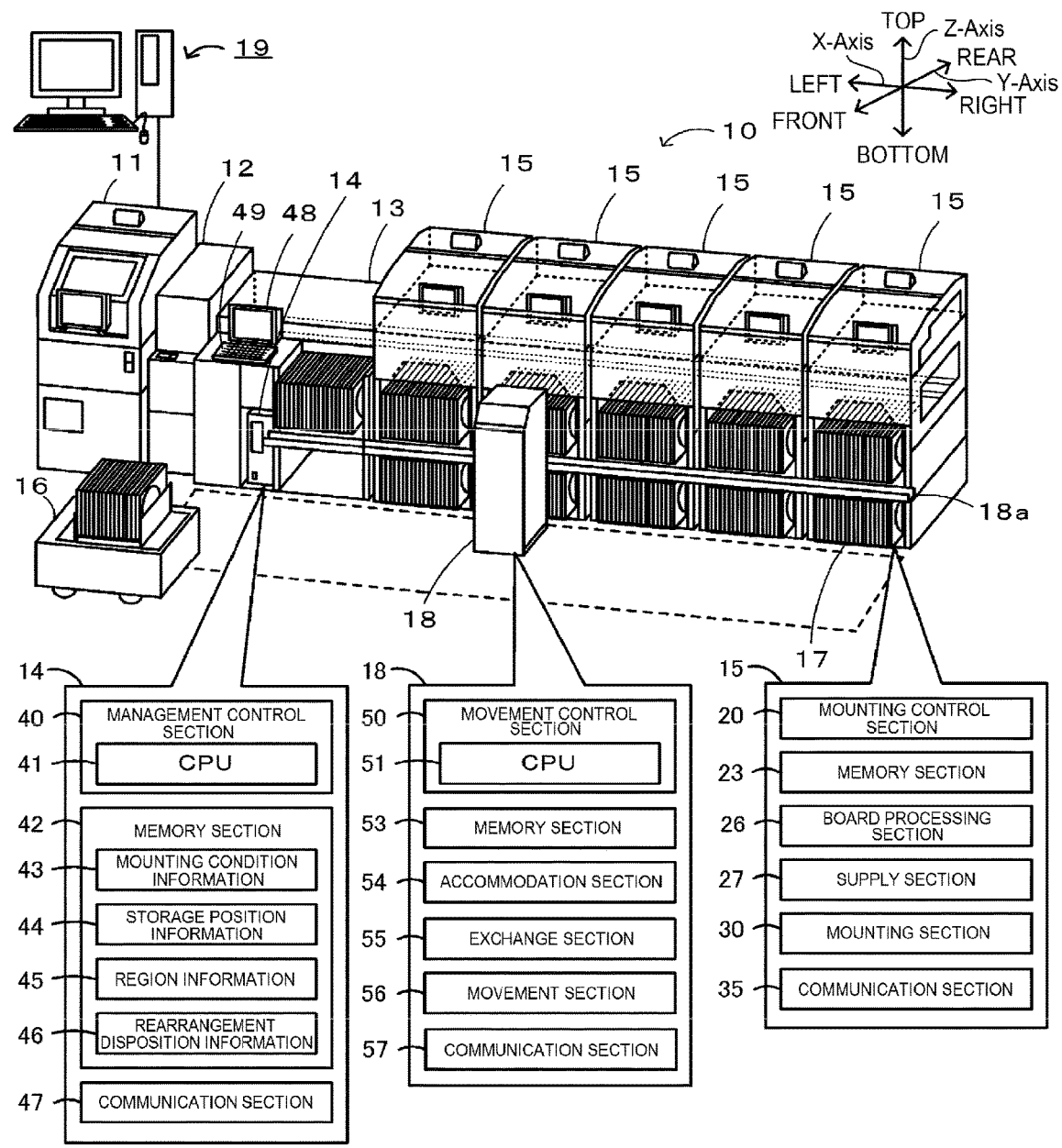
FIG. 1 is a schematic explanatory diagram illustrating an example of mounting system 10.
Figure 2:
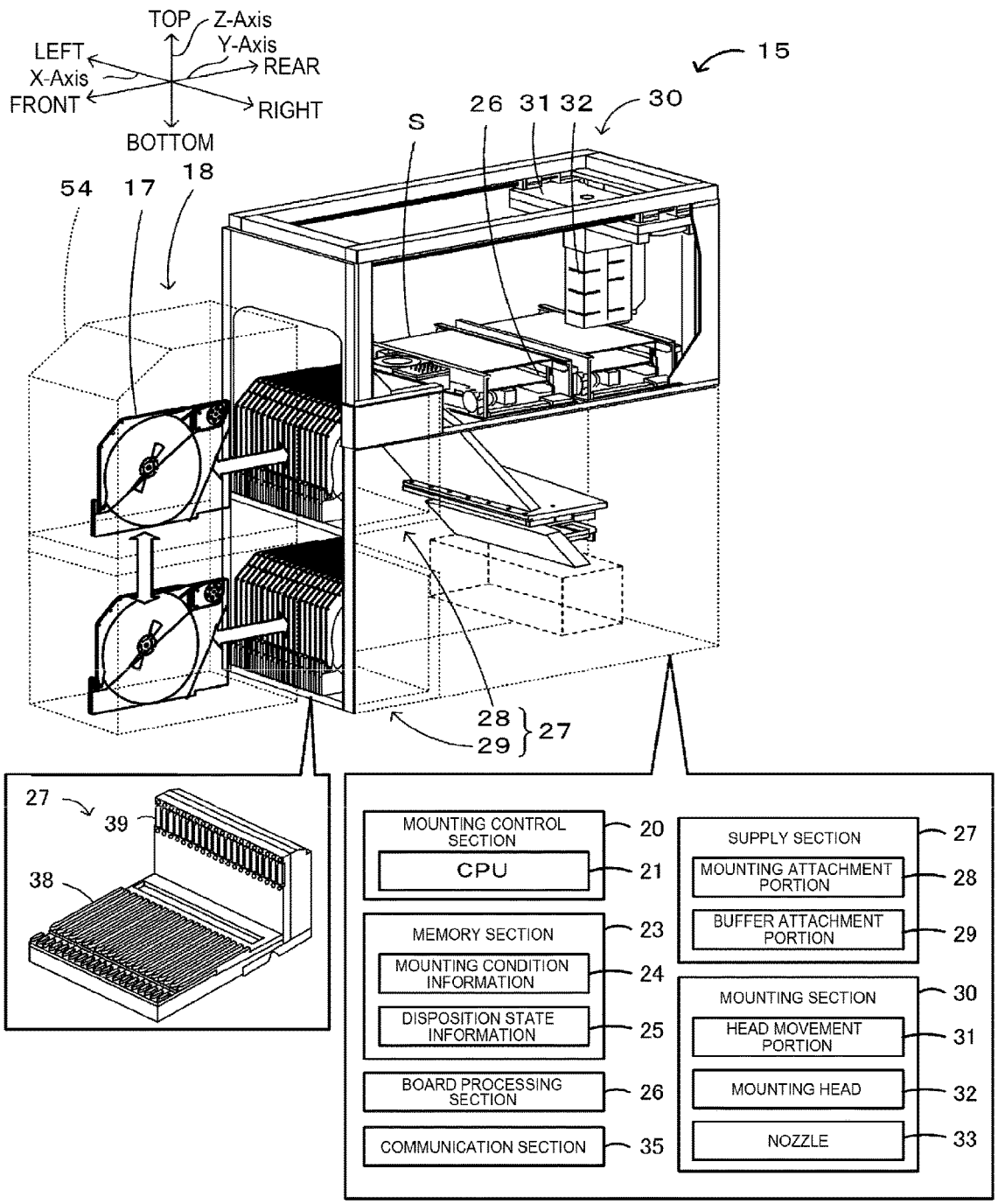
FIG. 2 is an explanatory diagram schematically illustrating configurations of mounting device 15 and loader 18.

Hereinafter, the present embodiment will be described with reference to the drawings. FIG. 1 is a schematic explanatory diagram illustrating an example of mounting system 10 of the present disclosure. FIG. 2 is an explanatory diagram schematically illustrating a configuration of mounting device 15 and loader 18 that is a movable work device. FIGS. 3 to 5 are explanatory diagrams illustrating examples of region information 45A to 45C stored in memory section 42 of management PC 14. In the present embodiment, a leftward-rightward direction (X-axis), a front-rear direction (Y-axis), and an upward-downward direction (Z-axis) are as illustrated in FIGS. 1 and 2.

Mounting system 10 is configured as, for example, a production line in which mounting devices 15 that perform a mounting process for mounting components on board S that is a mounting target are arranged in a conveyance direction of board S. Here, the mounting target is described as board S, but is not particularly limited to this as long as components are mounted thereon, and a substrate having a three-dimensional shape may be used. As illustrated in FIG. 1, mounting system 10 is configured to include printing device 11, print inspection device 12, storage section 13, management PC 14, mounting devices 15, automatic conveyance vehicle 16, loader 18, host PC 19, and the like. Printing device 11 is a device that prints a solder paste or the like on board S. Print inspection device 12 is a device that inspects a state of the printed solder.

Mounting devices 15 are devices that pick up components and mount the components on board S. Mounting device 15 includes mounting control section 20, memory section 23, board processing section 26, supply section 27, mounting section 30, and communication section 35. Mounting control section 20 is configured as a microprocessor centered on CPU 21 and controls the entire device, as illustrated in FIG. 2. Mounting control section 20 outputs control signals to board processing section 26, supply section 27, or mounting section 30 to cause mounting section 30 to pick up the components, and receives signals from board processing section 26, supply section 27, or mounting section 30. Mounting condition information 24, disposition state information 25, and the like are stored in memory section 23. Mounting condition information 24 is a production job and includes information such as information regarding a component, a disposition order in which components are mounted on board S, a component disposition position, and an attachment position of feeder 17 from which a component is picked up. Mounting condition information 24 is generated by host PC 19 according to a pickup order and a disposition order having high mounting efficiency, and is transmitted from host PC 19 to be stored into memory section 23. Disposition state information 25 is information including the type and a usage state (component type, the remaining number of components, or the like) of feeder 17 that is currently attached to supply section 27 of mounting device 15. In a case in which feeder 17 is attached or detached, disposition state information 25 is appropriately updated to the current details. Communication section 35 is an interface that performs exchange of information with external devices such as management PC 14 and host PC 19.

Board processing section 26 is a unit that performs carrying in, conveyance, fixation of board S at a mounting position, and carrying out thereof. Board processing section 26 has a pair of conveyor belts that are provided to be spaced apart from each other in the front-rear direction and are stretched in the leftward-rightward direction in FIG. 2. Board S is conveyed by the conveyor belts. Board processing section 26 includes two pairs of the conveyor belts, and can convey and fix two boards S simultaneously.

Supply section 27 is a unit that supplies components to mounting section 30. Supply section 27 has feeders 17 each of which includes a reel around which a tape as a holding member holding a component is wound and which are attached to one or more attachment portions. As illustrated in FIG. 2, supply section 27 has two upper and lower attachment portions to which feeders 17 are attachable at the front. The upper stage is mounting attachment portion 28 from which the component can be picked up by mounting section 30, and the lower stage is buffer attachment portion 29 from which the component cannot be picked up by mounting section 30. Here, mounting attachment portion 28 and buffer attachment portion 29 are collectively referred to as attachment portions. Feeder 17 from which the component is picked up by mounting head 32 is attached to mounting attachment portion 28. Buffer attachment portion 29 is used in a case in which feeder 17 that is to be used next or feeder 17 which has been used is temporarily stored. Buffer attachment portion 29 is served in advance with provision feeder 17 that is replaced due to component shortage, feeder 17 for setup change that is used in the next production, or the like. Supply section 27 has an attachment portion including multiple slots 38 arranged in the X direction at predetermined intervals, into which rail members of feeders 17 are inserted, and connection parts 39 into which connectors provided at the distal ends of feeders 17 are inserted. Feeder 17 includes a controller (not illustrated). The controller stores information such as an ID of the tape included in feeder 17, the component type, the remaining number of components, or the like. In a case in which feeder 17 is connected to connection part 39, the controller transmits the information regarding feeder 17 to mounting control section 20.

Mounting section 30 is a unit that picks up a component from supply section 27 and disposes the component on board S fixed to board processing section 26. Mounting section 30 includes head movement portion 31, mounting head 32, and nozzle 33. Head movement portion 31 includes a slider moved by being guided by guide rails in the XY-directions, and a motor that drives the slider. Mounting head 32 picks up one or more components and is moved in the XY-directions by head movement portion 31. Mounting head 32 is detachably attached to the slider. One or more nozzles 33 are detachably attached to a lower surface of mounting head 32. Nozzle 33 picks up a component by using a negative pressure. Instead of nozzle 33, a pickup member that picks up a component may be a mechanical chuck or the like that mechanically holds a component.

Storage section 13 is a storage location for storing feeders 17 used in mounting device 15. Storage section 13 is provided under a conveyance device between print inspection device 12 and mounting device 15. Storage section 13 has an attachment portion provided with slots 38 and connection parts 39 similar to those of supply section 27. When feeder 17 is connected to the attachment portion, the controller of feeder 17 transmits information regarding feeder 17 to management PC 14. The attachment portions of storage section 13 may be managed in the unit of a storage module grouped into a predetermined number (for example, four or twelve). In this mounting system 10, an example having three storage modules will be mainly described (refer to FIGS. 3 to 5 that will be described later). In storage section 13, feeder 17 may be conveyed by loader 18 or feeder 17 may be conveyed by an operator.

Management PC 14 is a device that manages feeder 17, stores execution data executed by loader 18, and manages loader 18. As illustrated in FIG. 1, management PC 14 includes management control section 40, memory section 42, communication section 47, display section 48, and input device 49. Display section 48 is a liquid crystal screen that displays various information. Input device 49 includes a keyboard, a mouse, and the like used for an operator to input various commands. Management control section 40 is configured as a microprocessor centered on CPU 41 and controls the entire device. Memory section 42 stores mounting condition information 43, storage position information 44, region information 45, rearrangement disposition information 46, and the like as information for controlling loader 18. Mounting condition information 43 includes the same details as those of mounting condition information 24, and is transmitted from host PC 19 and is stored in memory section 42. Storage position information 44 includes information regarding storage positions of provision feeder 17 and recovery feeder 17 temporarily stored in storage section 13. Storage position information 44 includes the type and a use state of feeder 17 (the component type, the remaining number of components, and the like) that is currently attached to an attachment portion of storage section 13. When the attachment or detachment of feeder 17 to or from storage section 13 is performed, management PC 14 appropriately updates storage position information 44 to the current content.

Region information 45 is information including ranges of a recovery storage region and a provision storage region set in storage section 13. Region information 45 includes ranges of a recovery storage region and a provision storage region that are freely set in advance by an operator. For example, management PC 14 may enable an operator to select any of region information 45A to 45C as illustrated in FIGS. 3 to 5. As illustrated in FIG. 3, region information 45A includes a portion in which a recovery storage region and a provision storage region are defined in the storage module unit of storage section 13 including multiple storage modules (storage modules 1 and 3). Region information 45A also includes a portion in which the recovery storage region and the provision storage region are defined as a group in the storage module (storage module 2). As illustrated in FIG. 4, region information 45B defines a recovery storage region and a provision storage region as a group in the storage module (storage modules 1 to 3). As illustrated in FIG. 5, in region information 45C, a recovery storage region is defined as multiple regions in the storage module, and a provision storage region is defined as multiple regions (storage modules 1 to 3). In region information 45A to 45C, the recovery storage region is present on a warehouse side (on the left side in FIG. 1), and the provision storage region is present on a mounting device 15 side (on the right side in FIG. 1), either as a whole or as a storage module of storage section 13. In region information 45A, an operator can easily understand a storage position and the type of feeder 17 that is temporarily stored. In region information 45B, the feeder can be managed for each storage module. In region information 45B, since steps occur in a movement distance of loader 18 in each region of each storage module, such as being closer to the warehouse or being closer to mounting device 15, it is possible to perform operations according to the necessity of feeder 17. In region information 45C, since the respective regions are interlaced with each other such that recovery and provision of loader 18 can be performed simultaneously, it is possible to minimize a movement distance of loader 18 and thus to reduce the time. Rearrangement disposition information 46 is information used when feeders 17 that are temporarily stored in storage section 13 as appropriate for each region are rearranged. Rearrangement disposition information 46 is information created by management PC 14 when there is an idle time in loader 18 based on mounting condition information 43, storage position information 44, and region information 45. Rearrangement disposition information 46 includes information such as an attachment position of recovery feeder 17 and provision feeder 17 in storage section 13, and a rearrangement order of these feeders 17.

Automatic conveyance vehicle 16 automatically conveys feeder 17, a member used in mounting system 10, and the like between the warehouse (not illustrated) and storage section 13. The warehouse stores feeders 17 or other members.

Loader 18 is a movable work device and is a device that is moved within a movement region in front of mounting system 10 (refer to a dotted line in FIG. 1) and automatically recovers and provides feeders 17 of mounting device 15. Loader 18 includes movement control section 50, memory section 53, accommodation section 54, exchange section 55, movement section 56, and communication section 57. Movement control section 50 is configured as a microprocessor centered on CPU 51 and controls the entire device. Movement control section 50 controls the entire device to recover feeder 17 from supply section 27 or provide feeder 17 to supply section 27 and to move feeder 17 to and from storage section 13. Memory section 53 is, for example, an HDD that stores various data such as a processing program, and stores disposition state information, attachment portion use information, and the like. Accommodation section 54 has an accommodation space in which feeders 17 are accommodated. Accommodation section 54 is configured to be able to accommodate, for example, four feeders 17. Exchange section 55 is a mechanism that carries feeder 17 in and out and moves feeder 17 to upper and lower stages (refer to FIG. 2). Exchange section 55 has a clamp portion that clamps feeder 17, a Y-axis slider that moves the clamp portion in the Y-axis direction (front-rear direction), and a Z-axis slider that moves the clamp portion in the Z-axis direction (upward-downward direction). Exchange section 55 performs attachment and detachment of feeder 17 in mounting attachment portion 28 and attachment and detachment of feeder 17 in buffer attachment portion 29. Movement section 56 is a mechanism that moves loader 18 in the X-axis direction (leftward-rightward direction) along X-axis rail 18a disposed in front of mounting device 15. Communication section 57 is an interface that performs exchange of information with external devices such as management PC 14 and mounting device 15. Loader 18 outputs the current position and executed work details to management PC 14.

The host PC 19 (refer to FIG. 1) is configured as a server creating and managing information used by each device of mounting system 10, such as mounting condition information 24.

Next, an operation of mounting system 10 according to the present embodiment configured as described above, particularly, a mounting process executed by mounting device 15 will be first described. In the mounting process, CPU 21 of mounting device 15 executes a process of reading and acquiring mounting condition information 24, causing mounting section 30 to pick up a component from feeder 17 attached to supply section 27 based on the information included in mounting condition information 24, and disposing the component on board S conveyed and fixed to board processing section 26. When component shortage occurs in feeder 17 during the execution of the mounting process, CPU 21 outputs a signal to management PC 14, and causes loader 18 to execute an operation of replacing feeder 17 in which the component shortage has occurred. As described above, mounting device 15 continues the mounting process while replacing feeder 17.

Figure 6:
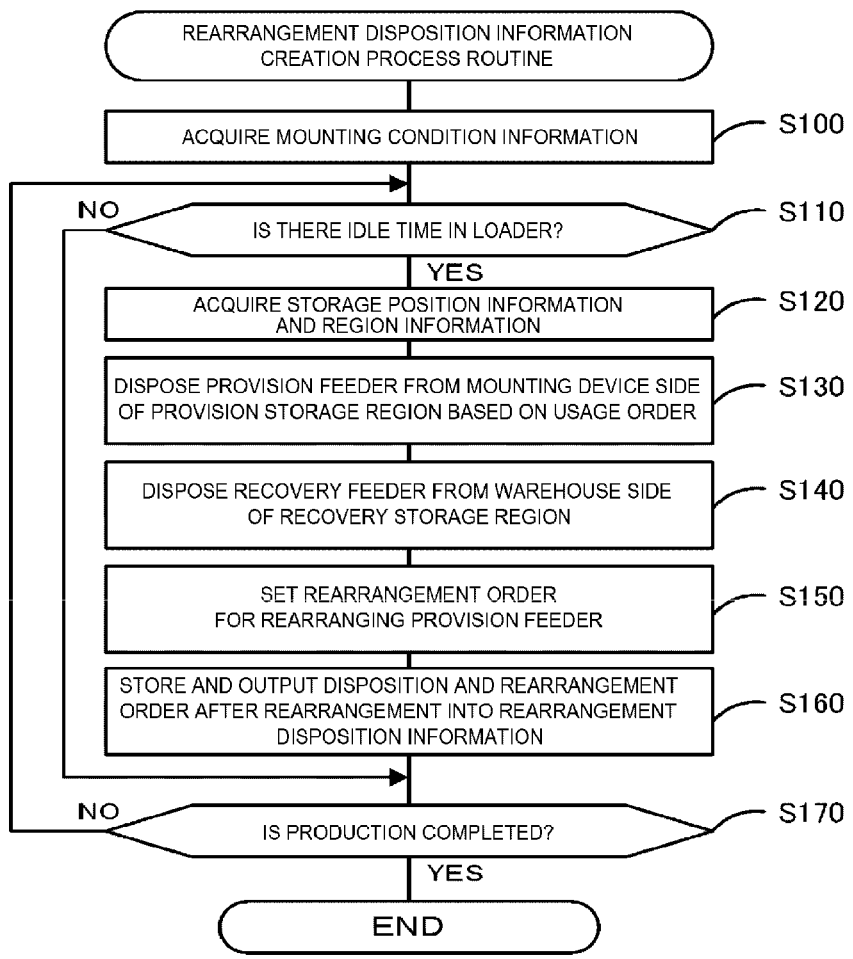
FIG. 6 is a flowchart illustrating an example of a rearrangement disposition information creation process routine.

Next, an operation of mounting system 10 according to the present embodiment configured as described above, particularly, a process in which management PC 14 sets rearrangement disposition information 46 will be described. FIG. 6 is a flowchart illustrating an example of a rearrangement disposition information creation process routine executed by CPU 41 included in management control section 40 of management PC 14. This routine is stored in memory section 42 of management PC 14, and executed by CPU 41 after mounting system 10 is activated. Here, it is assumed that any of region information 45A to 45C among region information 45 is selected by an operator in advance. When this routine is started, CPU 41 reads and acquires mounting condition information 43 from memory section 42 (S100), and determines whether there is any idle time in loader 18 (S110). The idle time of loader 18 may be determined, for example, based on whether a replacement operation due to component shortage of feeder 17 is within a predetermined time period from the present time based on mounting condition information 43. The presence or absence of the replacement operation of feeder 17 due to the component shortage may be detected based on the remaining number of components of feeder 17 and an amount of component consumption per unit time. The idle time may be set as, for example, a time (for example, 5 minutes, 10 minutes, or 30 minutes) for which a rearrangement operation for feeder 17 can be executed in storage section 13 between a replacement operation including movement of loader 18 and the next replacement operation. The idle time may be set, for example, by empirically obtaining a rearrangement time required for movement of loader 18 or rearrangement of feeder 17, and based on the rearrangement time.

When there is an idle time in loader 18 in S110, CPU 41 reads and acquires storage position information 44 and region information 45 from memory section 42 (S120), and ascertains, for example, the type or a position of feeder 17 currently disposed in storage section 13. CPU 41 acquires the currently selected recovery storage region and provision storage region from region information 45. Next, CPU 41 generates disposition information in which provision feeders having a higher usage order are rearranged in order from the side closer to mounting device 15, based on usage orders of feeders 17 included in mounting condition information 24 (S130). Regarding the usage order of provision feeder 17, for example, similarly to the above-described component shortage, a time point at which the component shortage occurs may be obtained for each feeder 17 based on the remaining number of components of feeder 17 and an amount of component consumption per unit time, and the usage order may be made higher from an order of the earlier time point. For example, in a case where region information 45A in FIG. 3 is selected, CPU 41 creates an disposition order for rearranging provision feeders 17 in an order of the attachment portion numbers 36, 35, . . . . Next, CPU 41 creates disposition information for rearranging recovery feeders 17 in order from the warehouse side of the recovery storage region (S140). For example, in a case where region information 45A in FIG. 3 is selected, CPU 41 creates an disposition order for rearranging recovery feeders 17 in an order of the attachment portion numbers 1, 2, . . . . Since recovery feeder 17 may not have a temporal order, CPU 41 may define a disposition position such that a movement distance of feeder 17 is reduced.

Subsequently, CPU 41 sets a rearrangement order for rearranging provision feeders 17 first such that feeder 17 is moved to the defined disposition position (S150). Since replacement of feeder 17 in which component shortage occurs in supply section 27 is prioritized, loader 18 may interrupt rearrangement in storage section 13. Thus, CPU 41 sets a rearrangement order in which provision feeders 17 are preferentially rearranged. In step S150, in a case where another feeder 17 is already attached at a position where the corresponding provision feeder is to be disposed, CPU 41 may set a rearrangement order for moving the corresponding provision feeder to the position after moving another feeder 17 to a nearby free attachment portion. As described above, after a rearrangement order of provision feeders 17 is set, CPU 41 sets a rearrangement order of recovery feeders 17.

CPU 41 stores a disposition position of feeder 17 after the set rearrangement and the set rearrangement order into rearrangement disposition information 46, and outputs rearrangement disposition information 46 to loader 18 (S160). Loader 18 having acquired rearrangement disposition information 46 executes a rearrangement operation on provision and recovery feeders 17 in storage section 13 based on details of rearrangement disposition information 46. After S160, CPU 41 determines whether the production of board S is completed by mounting system 10 (S170), and executes the processes in and after S110 when the production is not completed. On the other hand, when the entire production of board S is completed in S170, the routine is finished. In storage section 13, since recovery or provision feeder 17 is temporarily stored in a determined region, for example, even in a case where an operator performs an operation, the operator can easily understand the type of feeder 17.

Figure 7:
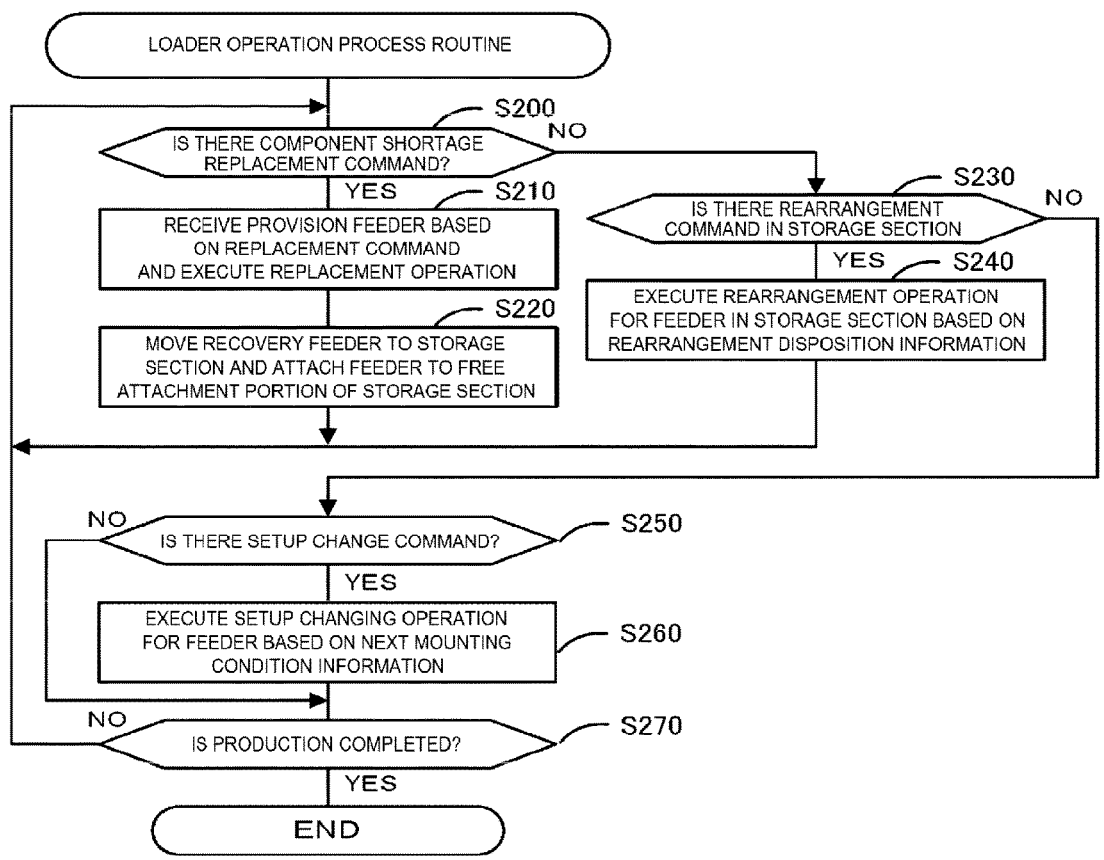
FIG. 7 is a flowchart illustrating an example of a loader operation process routine.

Next, a process of executing a replacement operation of loader 18 will be described. FIG. 7 is a flowchart illustrating an example of a loader operation process routine executed by CPU 51 of movement control section 50. This routine is stored in memory section 53, and is executed by CPU 51 after mounting system 10 is activated. When this routine is started, CPU 51 determines whether there is a replacement command due to component shortage (S200), and, when there is a replacement command, receives provision feeder 17 from storage section 13 or buffer attachment portion 29 based on the replacement command, and executes a replacement operation of replacing feeder 17 in supply section 27 (S210). Next, CPU 51 moves recovered feeder 17 to storage section 13, attaches feeder 17 to any of free attachment portions of storage section 13 (S220), and executes the processes in and after S200. CPU 51 may move recovery feeder 17 to storage section 13 after temporarily attaching recovery feeder 17 to buffer attachment portion 29.

On the other hand, when there is no component replacement command in S200, CPU 51 determines whether there is a rearrangement command in storage section 13 (S230). This determination may be performed based on whether rearrangement disposition information 46 has been acquired. When there is a rearrangement command, CPU 51 executes a rearrangement operation on recovery feeders 17 or provision feeders 17 in storage section 13 based on rearrangement disposition information 46 (S240), and executes the processes in and after S200. CPU 51 performs rearrangement in the set rearrangement order such that provision feeders 17 are disposed in the provision storage region, and recovery feeders 17 are disposed in the recovery storage region. when there is a component shortage replacement command during execution of the rearrangement operation, CPU 51 executes the replacement operation by prioritizing the replacement command.

On the other hand, when there is no rearrangement command in S230, CPU 51 determines whether there is a setup change command for starting the next production (S250). When there is a setup change command, CPU 51 executes a setup changing operation for feeder 17 based on the following mounting condition information (S260). In this case, loader 18 also moves used feeder 17 to storage section 13 as recovery feeder 17. After S260 or when there is no setup change command in S250, CPU 51 determines whether the production of board S is entirely completed (S270), and executes the processes in and after S200 when the production of board S is not completed. On the other hand, when the production of board S is completed, CPU 51 finishes the routine.

Here, a correspondence relationship between the constituent elements of the present embodiment and the constituent elements of the present disclosure will be clarified. Mounting device 15 of the present embodiment corresponds to a mounting device, management PC 14 corresponds to a management device, and loader 18 corresponds to a movable work device. Management control section 40 corresponds to a management control section, mounting attachment portion 28 and buffer attachment portion 29 correspond to attachment portions, mounting section 30 corresponds to a mounting section, mounting control section 20 corresponds to a mounting control section, and movement control section 50 corresponds to a movement control section. Storage position information 44 corresponds to storage position information, region information 45 corresponds to region information, rearrangement disposition information 46 corresponds to rearrangement disposition information, and board S corresponds to a mounting target. In the present embodiment, an example of a management method of the present disclosure is also clarified by describing the operation of management control section 40.

In mounting system 10 described above, management control section 40 creates rearrangement disposition information 46 in which provision feeders 17 are rearranged in a provision storage region and recovery feeders 17 are rearranged in a recovery storage region among feeders 17 temporarily stored in storage section 13 based on storage position information 44 regarding storage positions of provision feeder 17 and recovery feeder 17 temporarily stored in storage section 13 and region information 45 including the recovery storage region and the provision storage region set in storage section 13, and outputs created rearrangement disposition information 46 to loader 18. In management PC 14, since feeders 17 temporarily stored in storage section 13 can be rearranged in the predefined recovery storage region or provision storage region by using rearrangement disposition information 46, it is possible to perform more appropriate storage according to the type of feeder such as a provision feeder or a recovery feeder in the storage section that temporarily stores feeders 17.

Management control section 40 acquires usage order information including a usage order of provision feeders 17 from mounting condition information 43, and creates rearrangement disposition information 46 for rearranging provision feeders 17 having a higher usage order from a side closer to mounting device 15. In management PC 14, since provision feeders 17 are arranged in an array according to the usage order, it is possible to further improve the operation efficiency related to feeder replacement. Since management control section 40 creates rearrangement disposition information 46 in which recovery feeders 17 are rearranged in order from the warehouse side, that is, the side farther from mounting device 15, it is easy to remove recovery feeders 17 from storage section 13. Mounting system 10 includes loader 18 that moves feeder 17 to be recovered from supply section 27 or feeder 17 to be supplied to supply section 27, and management control section 40 outputs rearrangement disposition information 46 to loader 18 such that loader 18 executes a rearrangement operation of rearranging feeders 17. In management PC 14, since loader 18 rearranges feeders 17, it is possible to further reduce the operation load on an operator.

Since management control section 40 creates and outputs rearrangement disposition information 46 between movement operations executed by loader 18 to cause loader 18 to execute a rearrangement operation, feeder 17 can be temporarily stored more appropriately while giving priority to a movement operation for feeder 17. Management control section 40 uses any of region information 45A in which the recovery storage region and the provision storage region are defined in the storage module unit of storage section 13 including multiple storage modules, region information 45A and 45B in which the recovery storage region and the provision storage region are defined as a group in the storage module of storage section 13 including one or more storage modules, and region information 45C in which the recovery storage region is defined as multiple regions and the provision storage region is defined as multiple regions in the storage module of storage section 13 including one or more storage modules. In management PC 14, it is possible to temporarily store feeder 17 in storage section 13 more appropriately by using more suitable region information. Since mounting system 10 includes management PC 14 that sets rearrangement disposition information 46, it is possible to perform more appropriate storage in storage section 13 according to the type of feeder 17.

It is obvious that the present disclosure is not limited to the above-described embodiment and can be implemented in various aspects as long as the aspects belong to the scope of the present disclosure.

For example, in the above embodiment, rearrangement disposition information 46 for rearranging provision feeders 17 having a higher usage order from the side closer to mounting device 15 is created; however, the configuration is not particularly limited to this as long as provision feeders 17 are disposed in the provision storage region. For example, management control section 40 may allow a part of the disposition in which usage orders is exchanged, and may set rearrangement disposition information 46 in a tendency for provision feeder 17 having a higher usage order to be disposed at a position closer to mounting device 15. Management control section 40 may set rearrangement disposition information 46 for disposing provision feeder 17 in the provision storage region regardless of a usage order. Also in storage section 13, since predetermined feeder 17 is disposed in a predetermined region, it is possible to perform more appropriate storage according to the type of feeder such as a provision feeder or a recovery feeder.

In the above embodiment, recovery feeders 17 are rearranged in order from the side farther from mounting device 15; however, the configuration is not particularly limited to this as long as recovery feeders 17 are disposed in the recovery storage region. Also in storage section 13, since predetermined feeder 17 is disposed in a predetermined region, it is possible to perform more appropriate storage according to the type of feeder such as a provision feeder or a recovery feeder.

In the above embodiment, the rearrangement operation is executed by loader 18 between the movement operations for feeder 17 executed by loader 18; however, the configuration is not particularly limited to this, and the rearrangement operation may be executed at a predetermined timing, such as a defined time, before recovery to a warehouse, or before provision to supply section 27. Also in storage section 13, since predetermined feeder 17 is disposed in a predetermined region, it is possible to perform more appropriate storage according to the type of feeder such as a provision feeder or a recovery feeder.

In the above embodiment, mounting system 10 includes loader 18, and loader 18 moves and attaches feeder 17; however, the configuration is not particularly limited to this, and automatic conveyance vehicle 16 may perform the rearrangement operation for feeders 17. Alternatively, mounting system 10 may not include loader 18 and notify an operator of rearrangement disposition information 46, and the operator may execute the rearrangement operation for feeders 17 based on details of rearrangement disposition information 46. When the operator is notified of rearrangement disposition information 46, management PC 14 may display and output rearrangement disposition information 46 on display section 48, or may output sound from a speaker (not illustrated). Also in this mounting system 10, since predetermined feeder 17 is disposed in a predetermined region, it is possible to perform more appropriate storage according to the type of feeder such as a provision feeder or a recovery feeder.

In the above embodiment, mounting system 10 includes printing device 11, print inspection device 12, storage section 13, management PC 14, and mounting device 15; however, the configuration is not particularly limited to this, and one or more of the above devices may be omitted, or a device (for example, a reflow device) other than the above devices may be added.

In the above embodiment, management PC 14 provided in storage section 13 has been described as creating rearrangement disposition information 46; however, the configuration is not particularly limited to this, and other devices such as host PC 19, mounting device 15, and loader 18 may create rearrangement disposition information 46.

In the above embodiment, the present disclosure is applied to the form of mounting system 10, but the present disclosure may be applied to management PC 14 (management device), loader 18 (movable work device), a management method, and a program causing a computer to execute the management method.

Here, the management device, the movable work device, the mounting system, and the management method of the present disclosure may be configured as follows. For example, in the management device of the present disclosure, the management control section may acquire usage order information including a usage order of the provision feeders, and may create the rearrangement disposition information for rearranging the provision feeders having a higher usage order in order from the side closer to the mounting device. In this management device, since the provision feeders are arranged in an array according to the usage order, it is possible to further improve the operation efficiency related to the feeder replacement.

In the management device of the present disclosure, the management control section may create the rearrangement disposition information for rearranging recovery feeders in order from the side farther from the mounting device. In this management device, the recovery feeder can be easily removed from the storage section.

In the management device of the present disclosure, the mounting system may include a movable work device including a movement control section configured to execute a movement operation for moving the feeder to be recovered from the supply section or to be provided to the supply section, in which the management control section may output the rearrangement disposition information to the movable work device, and cause the movable work device to execute a rearrangement operation for rearranging the feeder. In this management device, since the movable work device rearranges the feeders, it is possible to further reduce the work load on the operator.

In the management device according to the present disclosure, the management control section may cause the movable work device to execute a rearrangement operation between the movement operations executed by the movable work device. In this management device, it is possible to temporarily store the feeder more appropriately while giving priority to the movement operation for the feeder. In the management device, the management control section may create the rearrangement disposition information between the movement operations, may output the rearrangement disposition information to the movable work device between the movement operations, or may output an execution command for the rearrangement disposition information to the movable work device between the movement operations. Here, the term "between the movement operations" indicates, for example, an idle time for which the rearrangement operation for the feeder can be executed between the movement operation of the movable work device and the next movement operation. The idle time may be set, for example, by empirically obtaining a necessary rearrangement time that is required for movement of the movable work device or rearrangement of the feeder, and based on the necessary rearrangement time.

In the management device of the present disclosure, the management control section may create the rearrangement disposition information by using any region information among the region information in which the recovery storage region and the provision storage region are defined in units of storage modules of the storage section including multiple storage modules, the region information in which the recovery storage region and the provision storage region are defined as a group in the storage module of the storage section including one or more storage modules, and the region information in which the recovery storage region is defined as multiple regions and/or the provision storage region is defined as multiple regions in the storage module of the storage section including one or more storage modules. In this management device, it is possible to temporarily store the feeder in the storage section more appropriately by using more suitable region information.

The movable work device of the present disclosure is a movable work device used in a mounting system including a mounting device including a mounting section configured to mount a component on a mounting target, a supply section having attachment portion to which a feeder holding the component is attached, and a mounting control section configured to cause the mounting section to pick up the component from the holding member, and a storage section provided in a production line configured by the mounting device and configured to temporarily store provision feeders to be provided to the supply section and recovery feeders recovered from the supply section, and includes a movement control section configured to execute a movement operation of moving the feeders such that the feeders are recovered from the supply section or the feeders are provided to the supply section, and execute a rearrangement operation of rearranging the recovery feeders in a recovery storage region and rearranging the provision feeders in a provision storage region, among the feeders temporarily stored in the storage section, based on rearrangement disposition information, the movement operation being executed based on storage position information regarding storage positions of the provision feeders and the recovery feeders temporarily stored in the storage section, and based on region information including the recovery storage region and the provision storage region set in the storage section.

The movable work device performs a movement operation of moving the feeder such that the feeder is recovered from the supply section or the feeder is provided to the supply section. The movable work device executes a rearrangement operation of rearranging the recovery feeders in the recovery storage region and rearranging the provision feeders in the provision storage region among the feeders temporarily stored in the storage section based on the rearrangement disposition information that is created by using the storage position information regarding storage positions of the provision feeders and the recovery feeders temporarily stored in the storage section and the region information including the recovery storage region and the provision storage region set in the storage section. In the movable work device, since the feeders temporarily stored in the storage section can be rearranged in a predefined recovery storage region or predetermined provision storage region by using the rearrangement disposition information, it is possible to perform more appropriate storage according to the type of feeder in the storage section.

The mounting system of the present disclosure includes a mounting device including a mounting section configured to mount a component on a mounting target, a supply section having attachment portion to which a feeder holding the component is attached, and a mounting control section configured to cause the mounting section to pick up the component from the holding member; a storage section provided in a production line configured by the mounting device and configured to temporarily store provision feeders to be provided to the supply section and recovery feeders recovered from the supply section; any one of the management devices; and a movable work device including a movement control section configured to execute a movement operation of moving the feeders such that the feeders are recovered from the supply section or the feeders are provided to the supply section, and execute a rearrangement operation of rearranging the feeders based on the rearrangement information.

Since the mounting system includes the management device described above, it is possible to perform more appropriate storage in the storage section according to the type of feeder.

The management method of the present disclosure is a management method used in a mounting system including a mounting device including a mounting section configured to mount a component on a mounting target, a supply section having attachment portion to which a feeder holding the component is attached, and a mounting control section configured to cause the mounting section to pick up the component from the holding member, and a storage section provided in a production line configured by the mounting device and configured to temporarily store provision feeders to be provided to the supply section and recovery feeders recovered from the supply section, and includes (a) a step of creating rearrangement disposition information for rearranging the recovery feeders in a recovery storage region and rearranging the provision feeders in a provision storage region among the feeders temporarily stored in the storage section by using storage position information regarding storage positions of the provision feeders and the recovery feeders temporarily stored in the storage section and region information including the recovery storage region and the provision storage region set in the storage section, and (b) a step of outputting the created rearrangement disposition information.

In this management method, similarly to the management device described above, since the feeders temporarily stored in the storage section can be rearranged in a predefined recovery storage region or predetermined provision storage region by using the rearrangement disposition information, it is possible to perform more appropriate storage according to the type of feeder in the storage section that temporarily stores the feeder. In the management method, various aspects of the management device described above may be employed, or steps for realizing each function of the management device described above may be added.

INDUSTRIAL APPLICABILITY

The present disclosure is applicable to the technical field of devices that pick up and mount components.

REFERENCE SIGNS LIST

10 Mounting system, 11 Printing device, 12 Print inspection device, 13 Storage section, 14 Management PC, 15 Mounting device, 16 Automatic conveyance vehicle, 17 Feeder, 18 Loader, 18a X-axis rail, 19 Host PC, 20 Mounting control section, 21 CPU, 23 Memory section, 24 Mounting condition information, 25 Disposition state information, 26 Board processing section, 27 Supply section, 28 Mounting attachment portion, 29 Buffer attachment portion, 30 Mounting section, 31 Head movement portion, 32 Mounting head, 33 Nozzle, 35 Communication section, 38 Slot, 39 Connection part, 40 Management control section, 41 CPU, 42 Memory section, 43 Mounting condition information, 44 Storage position information, 45 Region information, 46 Rearrangement disposition information, 47 Communication section, 48 Display section, 49 Input device, 50 Movement control section, 51 CPU, 53 Memory section, 54 Accommodation section, 55 Exchange section, 56 Movement section, 57 Communication section, S Board

The invention claimed is:

1. A mounting system comprising:
a mounting device which includes: a mounting section configured to mount a component on a mounting target; a supply section having an attachment portion to which a feeder holding the component is attached, and a mounting control section configured to cause the mounting section to pick up the component from the holding member;
a storage section, being provided in a production line configured by the mounting device, which is configured to temporarily store provision feeders to be provided to the supply section and recovery feeders recovered from the supply section;
a movable work device including a movement control section configured to execute a movement operation of moving the feeders such that the feeders are recovered from the supply section or the feeders are provided to the supply section; and
a management device comprising a management control section configured to determine whether there is idle time in the movable work device,
when there is idle time in the movable work device
acquire storage position information including storage positions of the provision feeders and the recovery feeders temporarily stored in the storage section, region information including a recovery storage region and a provision storage region, which is set in the storage section, and usage order information including a usage order of the provision feeders, create rearrangement disposition information for rearranging the recovery feeders in the recovery storage region and rearranging the provision feeders in the provision storage region among the feeders temporarily stored in the storage section resulting from the storage position information, the region information, and the usage order information such that the provision feeders having a higher usage order are first rearranged in order from a side closer to the mounting device and the recovery feeders are then rearranged in order from a side farther from the mounting device, and output the created rearrangement disposition information to the movable work device, and cause the movable work device to execute a rearrangement operation of rearranging the feeders using the created rearrangement disposition information.

2. The mounting system according to claim 1, wherein the management control section causes the movable work device to execute the rearrangement operation between the movement operations executed by the movable work device.

3. The mounting system according to claim 1, wherein the management control section creates the rearrangement disposition information by using any region information among the region information in which the recovery storage region and the provision storage region are defined in units of storage modules of the storage section including multiple storage modules, the region information in which the recovery storage region and the provision storage region are defined as a group in the storage module of the storage section including one or more storage modules, and the region information in which the recovery storage region is defined as multiple regions, and the provision storage region is defined as multiple regions in the storage module of the storage section including one or more storage modules.

* * * * *